US008643121B2

(12) United States Patent
Mueller et al.

(10) Patent No.: US 8,643,121 B2
(45) Date of Patent: Feb. 4, 2014

(54) SEMICONDUCTOR DEVICE AND METHOD OF MANUFACTURING A SEMICONDUCTOR DEVICE

(75) Inventors: Markus Mueller, Brussels (BE); Raghunath Singanamalla, Bangalore (IN)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/143,762

(22) PCT Filed: Nov. 23, 2009

(86) PCT No.: PCT/IB2009/055284
§ 371 (c)(1),
(2), (4) Date: Aug. 19, 2011

(87) PCT Pub. No.: WO2010/079389
PCT Pub. Date: Jul. 15, 2010

(65) Prior Publication Data
US 2011/0291206 A1  Dec. 1, 2011

(30) Foreign Application Priority Data
Jan. 12, 2009  (EP) .................................. 09100027

(51) Int. Cl.
H01L 21/70  (2006.01)

(52) U.S. Cl.
USPC ............. 257/407; 257/412; 257/E29.158; 257/E29.159; 257/E29.16

(58) Field of Classification Search
USPC .......... 438/197, 199, 308, 592; 257/288, 369, 257/388, 407, 412, E29.158, E29.159, 257/E29.16, E21.433, E21.635
See application file for complete search history.

(56) References Cited

U.S. PATENT DOCUMENTS

| 5,844,278 A | 12/1998 | Mizuno |
| 6,306,738 B1 | 10/2001 | Selcuk |
| 2005/0145893 A1* | 7/2005 | Doczy et al. .................. 257/288 |

(Continued)

FOREIGN PATENT DOCUMENTS

| WO | 0077828 | 12/2000 |
| WO | 2007068393 | 6/2007 |

OTHER PUBLICATIONS

International Search Report and Written Opinion, issued Mar. 18, 2010.
Huajie Zhou et al: "Modulate Work Function of Ni-FUSI metal gate by implanting Yb" Solid-State and Integrated-Circuit Technology, 2008. ICSICT 2008. 9th International Conference on IEEE, Piscataway, NJ, USA, Oct. 20, 2008.

(Continued)

Primary Examiner — Brook Kebede
(74) Attorney, Agent, or Firm — McClure, Qualey & Rodack, LLP

(57) ABSTRACT

A semiconductor device and a method of manufacturing a gate stack for such a semiconductor device. The device includes a gate stack that has a gate insulation layer provided over a channel region of the device, and a metal layer that is insulated from the channel region by the gate insulation layer. The metal layer contains work function modulating impurities which have a concentration profile that varies along a length of the metal layer from the source region to the drain region. The gate stack has a first effective work function in the vicinity of a source region and/or the drain region of the device and a second, different effective work function toward a center of the channel region.

20 Claims, 3 Drawing Sheets

(56) References Cited

U.S. PATENT DOCUMENTS

| | | | |
|---|---|---|---|
| 2006/0244079 A1* | 11/2006 | Wang et al. | 257/407 |
| 2007/0215950 A1* | 9/2007 | Aoyama | 257/369 |
| 2008/0197424 A1 | 8/2008 | Haensch | |

OTHER PUBLICATIONS

Chien-Ting Lin et al: "CMOS Dual-Work-Function Engineering by Using Implanted Ni-FUSI" IEEE Electron Device Letters, IEEE Service Center, New York, NY, US, Sep. 1, 2007.

* cited by examiner

SEMICONDUCTOR DEVICE AND METHOD OF MANUFACTURING A SEMICONDUCTOR DEVICE

CROSS-REFERENCE TO RELATED APPLICATION

This application is a co-pending application which claims priority to PCT Application No. PCT/IB2009/055284, filed, 23 Nov. 2009, entitled "Semiconductor Device and Method of Manufacturing a Semiconductor Device" which claims priority to European Patent Application No. 09100027.3, filed on 12 Jan. 2009 each of these applications being incorporated herein by reference in their entirety.

BACKGROUND OF THE INVENTION

This invention relates to a semiconductor device and a method of making the semiconductor device.

Semiconductor devices such as Metal Insulator Semiconductor Field Effect Transistors (MISFETs), and more particularly Metal Oxide Semiconductor Field Effect Transistors (MOSFETs) are being produced with ever decreasing dimensions, in an effort to increase the number of such devices that can be produced in a given area of semiconductor substrate. The critical dimension in a typical MOSFET is the length of the channel region, which extends between the source region and the drain region of the device, at a major surface of the substrate. Hereinafter, this dimension is referred to as the gate length $L_g$.

In larger devices, the threshold voltage is largely independent of $L_g$. However, it is well known that as $L_g$ is reduced, Short Channel Effects (SCEs) and Drain Induced Barrier Lowering (DIBL) become prominent, and can inhibit optimal performance of the device. Typically, these effects manifest themselves as a drop in threshold voltage $V_{th}$. This drop in $V_{th}$ is more commonly referred to as $V_{th}$ roll-off.

Physically, these effects can be explained by the electrostatic influence of the S/D regions (SCE) or an applied voltage on the drain (DIBL) on the channel region in very small devices, lowering the energy barrier for electrons or holes in the channel when the transistor is switched off (gate voltage zero), thus leading to higher off currents.

A number of ways of mitigating against SCEs such as DIBL have been developed. These include high effective channel doping and in particular, in smaller devices, the provision of pocket implants adjacent the source and drain regions (also known as halo implants). These approaches seek to locally modify (in the vicinity of the gate edge) the effective doping within the channel region of the device, and thereby maintain the gate voltage that is required to produce inversion within the channel. As a consequence the effective channel doping increases with decreasing channel length, raising the threshold voltage and thus leading to a counter effect to the SCE and DIBL.

However, these solutions have a number of disadvantages or problems associated therewith. The introduction of dopants into the channel region of the device generally leads to increased Coulomb scattering within the channel region, thereby reducing carrier mobility. Moreover, the large voltage barrier that is present between the source and drain regions and their associated pocket implants can lead to band-to-band tunnelling, which in turn leads to undesirable off-state leakage in the device.

Another known way of selectively controlling inversion within the channel region to compensate for SCE and DIBL is to provide a device that has a gate electrode with a work function that varies along the length of the channel. In particular, the value of the work function can be greater at the extremities of the gate than in the centre of the gate for NMOS transistors and smaller for PMOS transistors.

Such an inhomogeneous work function leads to a positive shift of the threshold voltage for NMOS devices whereas for PMOS devices this shift will be negative for decreasing gate lengths. In both cases, when the gate length is reduced, this trend is opposed to the SCE and DIBL effect which helps to achieve a desired flat curve of the threshold voltage versus the gate length.

EP1961038 describes a MOS transistor including a gate having a bottom part in contact with the gate oxide. The bottom part has an inhomogeneous work function along the length of the gate between the source and drain regions, the value of the work function being greater (smaller) at the extremities of the gate than in the centre of the gate for NMOS (PMOS). The gate comprises a first material in the centre and a second material in the remaining part. In EP1961038, this configuration is obtained by partial silicidation.

SUMMARY OF THE INVENTION

Particular and preferred aspects of the invention are set out in the accompanying independent and dependent claims. Combinations of features from the dependent claims may be combined with features of the independent claims as appropriate and not merely as explicitly set out in the claims.

According to a first aspect of the invention, there is provided a semiconductor device as defined in claim 1.

According to another aspect of the invention, there is provided a method of manufacturing a gate stack for a semiconductor device as defined in claim 11.

Embodiments of the claimed invention provide an alternative way of modifying the gate voltage that is required to produce inversion within the channel region. In particular, in accordance with an embodiment of the claimed invention, the effective work function of the gate stack comprising a metal layer and a gate insulation layer can be modulated by the introduction of impurities into the metal layer having a concentration profile that varies between the source region and the drain region of the device.

In one embodiment, for a PMOS transistor, the first effective work function, in the vicinity of the source and/or the drain regions of the device, is smaller than the second effective work function, towards the centre of the channel region. Conversely, in another embodiment, for a NMOS transistor, the first effective work function, in the vicinity of the source and/or the drain regions of the device, is greater than the second effective work function, towards the centre of the channel region.

In one embodiment, the gate stack comprises a further gate layer provided on the metal layer. This further gate layer can comprise polysilicon, which is commonly used to complete the gate stack in metal gate approaches. The further gate layer can be used during manufacture of the device to mask a portion of the metal layer from the introduction of the impurities, for forming the varied concentration profile of the impurities within the metal layer. The further gate layer may subsequently be removed.

The gate stack can be a fully metallic gate stack, without any silicided portions. This is achieved by virtue of the use of impurities in the metal layer, leading to work function modulations that do not require silicidation processes of the kind described in EP1961038.

Embodiments of the claimed invention can be implemented in very small devices to mitigate the effects of SCEs and DIBL. For example, the claimed invention can be implemented in devices in which the length of the channel region between the source region and the drain region is substantially equal to or is less than 65 nm or even 45 nm. In one embodiment, the thickness T of the metal layer is in the range 5 nm≤T≤15 nm.

In one embodiment, the work function modulating impurities can be introduced into the metal layer and the patterned further gate layer using a tilted ion implantation process. To overcome the effects of shadowing, but more particularly to ensure that the appropriate dose of impurities is introduced to either end of the metal layer (in the vicinity of the intended source and drain regions), the tilted ion implantation process can comprise implanting ions into the metal layer and the patterned further gate layer from at least a first direction and a second, different direction. The incident angle φ of each of the first and second directions with respect to a surface normal of the surface on which the gate insulation layer is deposited can be in the range 15°≤φ≤30°.

After implantation, an anneal can be performed for causing controlled diffusion of the work function modulating impurities in the metal layer toward the centre of the channel region. The concentration profile of the impurities in the metal layer can thereby be controllably adjusted to a desired level.

The invention can be implemented in any suitable device that requires a gate stack. Such devices include planar MISFETs (including FDSOI and planar multi-gate devices) as well as FinFETs (including any type of vertical multi gate device).

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention allow SCEs and DIBL present in semiconductor devices such as MOSFETs to be compensated in a way that does not require impurity implantation into the channel region of the device. Instead, impurities are introduced into a metal layer provided within the gate stack of the device, to tune the effective work function of the gate stack as a function of position along the length of the channel region. Despite this, it is also envisaged that the invention could be implemented in a device that includes features such as pocket implants and/or channel doping. In such devices, the combined effects of such features along with the metal layer containing impurities could counteract SCEs and DIBL. Additionally, although a specific embodiment of the invention is described below in relation to planar, bulk MISFETs, it is envisaged that the invention could equally be applied to other device topologies, including FinFET type devices.

Figure 1:
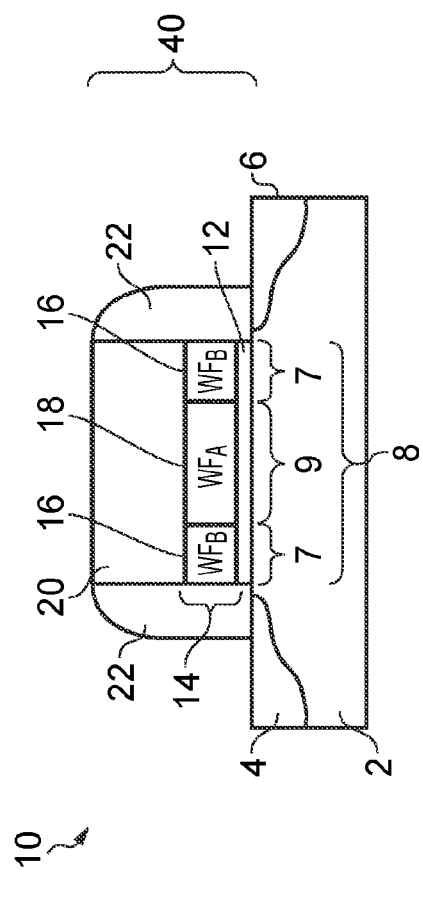
FIG. 1 schematically illustrates an example of a semiconductor device in accordance with an embodiment of the invention.

FIG. 1 shows an example of a device according to the invention. In this example, the device comprises a substrate 2 in which there are provided a source region 4 and a drain region 6. As shown schematically in FIG. 1, both the source region 4 and the drain region 6 may be provided with extension regions. The device can, for example, be a PMOS or an NMOS type MOSFET.

Extending between the source region 4 and the drain region 6 is a channel region 8. In this example, the channel region is formed at the major surface of the substrate 2. The present invention is fully compatible with deep submicron devices, and the channel region can have a length substantially equal to or less than 65 nm or even 45 nm.

On the major surface, over the channel region 8 there is provided a gate stack 40. The gate stack 40 includes a gate insulation layer 12, which may typically comprise an silicon-based oxide layer and/or a high-K material.

Over the gate insulation layer 12 there is provided a metal layer 14. The metal layer can comprise, for example, the following: HfSi, Mo, MoN, Ru, TiAlN, TiN, TiSiN, TaN, TaC, W. The metal layer can have a thickness in the range 5-15 nm.

Over the metal layer 14, there may be provided a further layer 20. In this example, the further layer 20 comprises polysilicon. As described below, the further layer can be used during manufacture of the device to mask certain portions of the metal layer against the introduction of impurities. In the finished device, the further layer 20 is not essential, however, and can be removed. The gate stack 40 can be fully metallic, and there is no need to use silicidation techniques of the kind described in EP1961038 in order provide a work function that varies along the length of the channel region 8.

The device 10 in this example also includes spacers 22 which are provided on either side of the stack 40.

It is envisaged that intermediate layers may be provided within the gate stack 40 as required. For example, layers may be provided intermediate the gate insulation layer 12 and the metal layer 14, or between the metal layer 14 and the further layer 20. Thus, the layers described above need not necessarily be located adjacent (or in direct contact with) each other as shown in FIG. 1.

As described above, the metal layer 14 includes work function modulating impurities. These impurities have a concentration profile that varies along the length of the channel region 8, such that the work function of the metal layer 14 is different (greater or smaller) in the proximity of the extremities of the metal layer 14 to the work function of the metal layer 14 toward the centre of the channel region. Thus, in the vicinity of the source and/or the drain regions 4, 6, the effective work function of the gate stack 40 is either greater than or smaller than the effective work function of the metal layer 14 away from the source and drain regions 4, 6.

It is envisaged that the increased/decreased effective work function of the gate stack 40 may only be present towards either the source region 4 or the drain region 6, the other of the two regions having a work function that is substantially the same as that of the remainder of the metal layer 14.

The impurities themselves may comprise, for example, As, P, Sb or Te for n-type tuning in the case of PMOS devices, or Al or B for p-type tuning in the case of NMOS devices. As described below, ion implantation techniques may be used to introduce these impurities into the metal layer, although any suitable alternative technique may also be used.

In the example shown in FIG. 1, the metal layer 14 has two regions 7 corresponding to the extremities of that layer 14, and a central region 9. The regions 7 of the metal layer are the regions in this example which have a greater or smaller work function. Correspondingly, the concentration of the above mentioned impurities within the metal layer 14 is greater in the regions 7 than in the central region 9. The size of the regions 7 relative to the size of the central region 9 can be tailored to a desired ratio using the methods described below in relation to FIG. 3.

Figure 2:
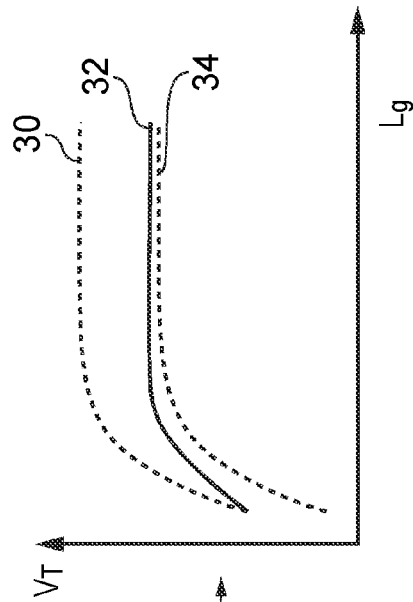
FIG. 2 schematically illustrates the effects of work function tuning on threshold voltage in accordance with an embodiment of the invention.
Figure 2:
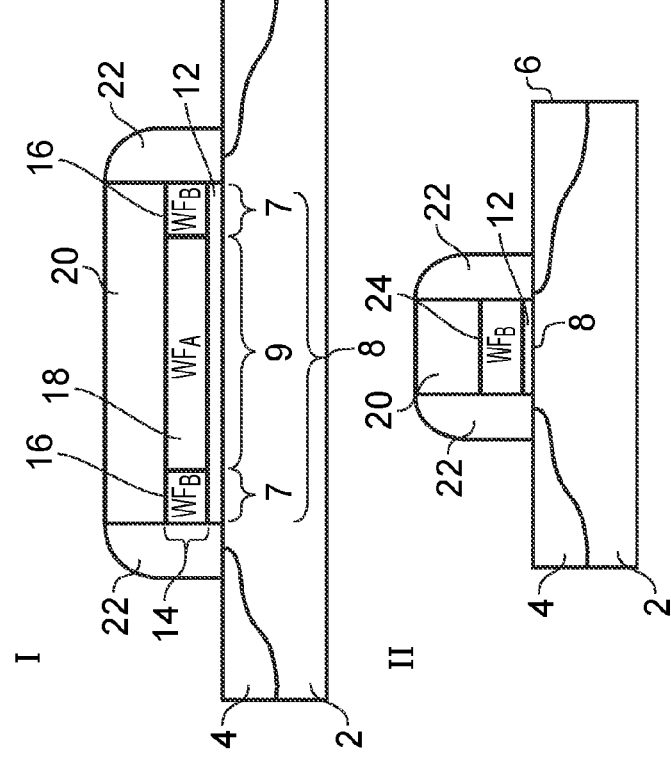

FIG. 2 schematically illustrates the effects of work function tuning of the kind described herein on threshold voltage of a device of the kind shown in FIG. 1.

On the left hand side of FIG. 2 there are shown two devices. The top left device (labelled device "I") represents a device having a relatively long gate length $L_g$, and a metal layer 14 having a central region 9 that is far larger than the side regions 7. In this example, the regions 7 have a work function $WF_B$, while the central region 9 has a work function $WF_A$. Because the regions 7 in device I are so small compared to the central region 9, the behaviour of device I will tend toward the behaviour of a device that has a metal layer having no impurities at all, and thus only a single work function $WF_A$.

The bottom left device (labelled device "II") has a far shorter gate length $L_g$ than device I. As a consequence, the central region 9 in device II is vanishingly small (the regions 7 having work function $WF_B$ meet at the centre of the channel region 8). The metal layer 14 in device II thus has only a single work function, $WF_B$.

On the right hand side of FIG. 2 there is a graph showing $V_{th}$ roll off for three kinds of device. The line 34 in the graph represents $V_{th}$ roll off for a device in which the metal layer has only a single WF equal to $WF_A$, while the line 30 represents $V_{th}$ roll off for a device in which the metal layer has only a single WF equal to $WF_B$. The line 32 represents $V_{th}$ roll off for a device according to an example of the present invention.

The graph illustrates that for device according to the present invention, at large gate lengths $L_g$ (corresponding to device I) the threshold voltage $V_{th}$ tends to behave like a device with a metal layer 14 having only work function $WF_A$. Thus line 32 in the graph in FIG. 2 tends toward the line 34 for large $L_g$.

However, as the gate length $L_g$ of a device according to the present invention is reduced, and as we move toward the regime represented by device II, line 32 diverges from line 34, and tends toward line 30, as the influence of the regions 7 having work function $WF_B$ increases.

Overall, the effect of providing the regions 7 having different work functions is to reduce $V_{th}$ roll off with reducing $L_g$, and produce a flatter $V_{th}$ versus $L_g$ curve.

FIGS. 3A-3G schematically illustrate a method of manufacturing a semiconductor device in accordance with an embodiment of the invention.

As with FIGS. 1 and 2, the example of FIG. 3 relates to a planar bulk MOSFET. The skilled person will appreciate that a gate stack of the kind described herein could also be incorporated into other devices, such as a FinFET device.

Figure 3B:
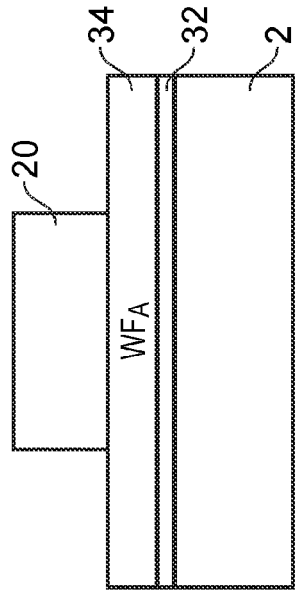
FIGS. 3A-3G schematically illustrate a method of manufacturing a semiconductor device in accordance with an embodiment of the invention.
Figure 3A:
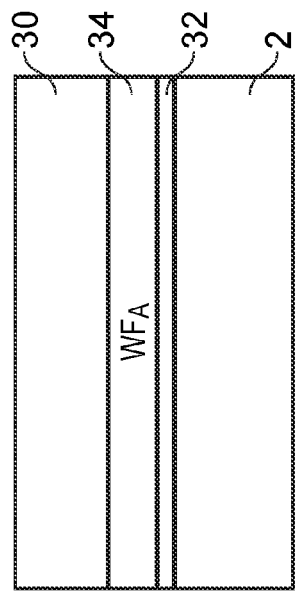

In a first stage of the method a plurality of gate forming layers are deposited on a substrate 2, forming the arrangement shown in FIG. 3A. The gate forming layers include an insulating layer 32, which is provided over a surface of the substrate 2. The insulating layer can comprise, for example, an oxide layer and/or a high-K material.

Over the insulating layer 32, there is provided a metal layer 34. The metal layer 34 can comprise, for example, the following: HfSi, Mo, MoN, Ru, TiAlN, TiN, TiSiN, TaN, TaC, W. The metal layer can have a thickness in the range 5-15 nm.

Over the insulating layer, there is provided a further layer 30. In this example, the further layer 30 comprises polysilicon. The thickness of the further layer can be chosen such that it effectively protects the underlying metal layer from implantation with exception of the edges, as described herein. The thickness of the further layer may typically be 3-5 times that of the metal layer, depending upon the ratio of density between further layer and metal.

Next, as shown in FIG. 3B, the further layer 30 is patterned to produce further layer 20. Further layer 20 has dimensions that correspond substantially to the intended dimensions of the finished gate stack. The patterning of the further layer 30 can be performed using any suitable process, such as photolithography with a selective etch. If it is desired that the further layer 20 be shielded to some extent from the implantation of impurities in the subsequent steps, a hard mask can be used.

Following the patterning described above, impurities 42 are introduced into the further layer 20 and the metal layer 34. In the present example, this is achieved using an ion implantation process. However, any suitable process can be used—plasma doping constitutes one such alternative, dopant out-diffusion from a solid reservoir (i.e. out of a solid layer deposited over the metal layer 34 and further layer 20) is another.

Figure 3D:
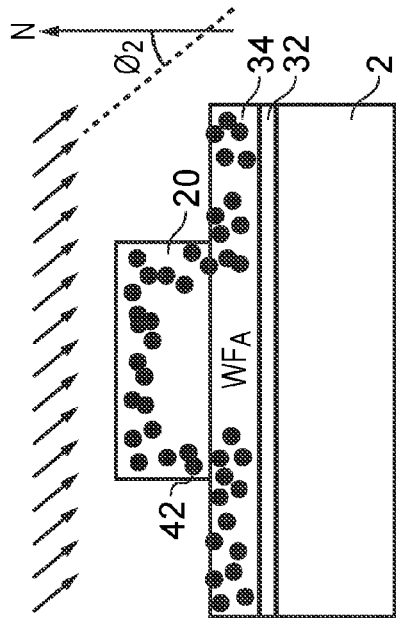
Figure 3C:
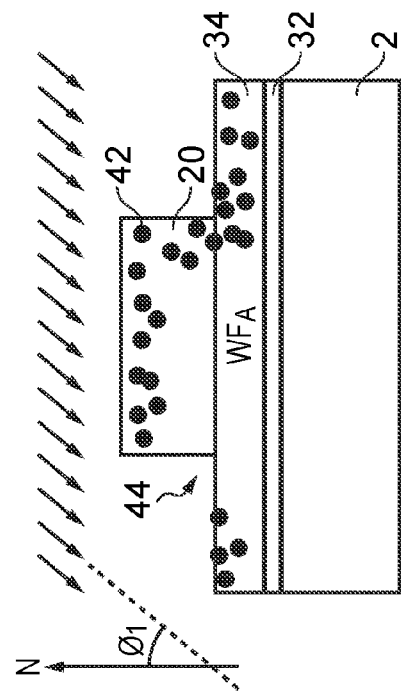

In a first stage of the ion implantation process illustrated in FIG. 3C, ions are implanted at a first angle $\phi_1$ to the surface normal of the surface upon which the insulating layer 32 was previously deposited (in the present example, this is the major surface of the semiconductor substrate 2). The tilted implantation allows the impurities to reach a portion of the metal layer 34 directly beneath a first side of the further layer 20. Accordingly, although some of the metal layer is masked by the further layer 20, at least some of the metal layer 34 beneath the further layer 20 is exposed to the impurities. The exposed portion corresponds generally to the regions 7 described above in relation to FIG. 1. It is noted that the further layer 20 also generally masks the region of the substrate 2 corresponding to the channel region 8 of the finished device.

Since the first stage of the ion implantation process is tilted, an opposite side 44 of the further layer 20 forms a shadow over a part of the metal layer, as is illustrated in FIG. 3C.

To account for this, and to ensure that a portion of the metal layer generally corresponding to a second of the regions 7 described above in relation to FIG. 1 is exposed to the impurities, a second implantation step can now be performed, at a second tilt angle $\phi_2$. This is illustrated in FIG. 3D.

Angles $\phi_1$ and $\phi_2$ are typically in the range 15-30 degrees, although it is noted that $\phi_1$ and $\phi_2$ need not necessarily be equal.

Typical dosages for the ion implantation steps can be of the order of $10^{15}$ cm$^{-2}$. Typical ion implantation energies would be between 1 and 20 keV depending on the ion mass.

It is further noted that the dosages used in the first and second implantation steps may not be the same. In particular, one of the two implantations may have a higher dosage than the other, to produce an asymmetric work function profile in the metal layer 34. Such an asymmetric work function may also be produced using unequal implantation angles $\phi_1$ and $\phi_2$ as described above.

Figure 3F:
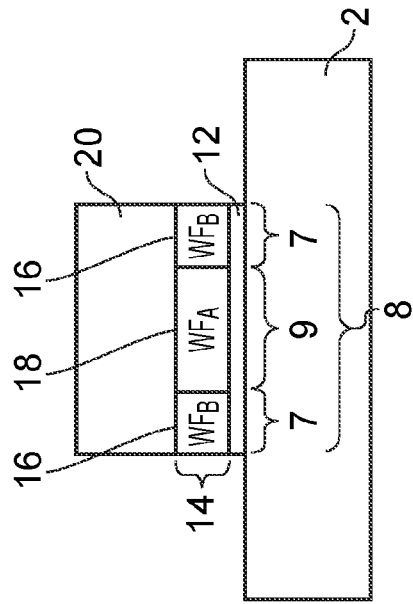
Figure 3E:
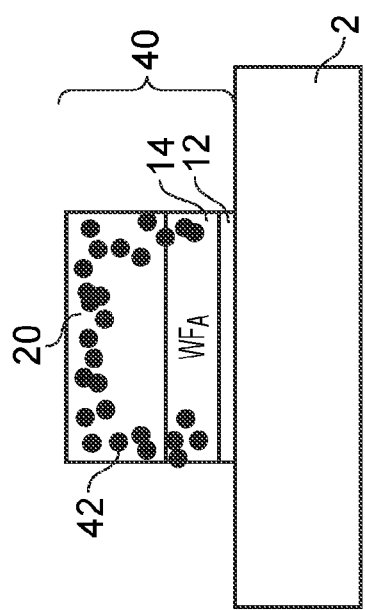

After completion of the implantation process, the portions of the metal layer 34 and the insulating layer 32 not directly beneath the further layer 20 are removed, resulting in the arrangement shown in FIG. 3E. This can, for example, be achieved using one or more selective etching steps. During the removal of the metal layer 34, the further gate layer acts as a hard mask, to assure a self aligned lateral variation of the dopant profile in the resulting metal layer 14.

The resulting arrangement comprises a gate stack 40 having a gate insulation layer 12, a metal layer 14 including impurities 42, and the further layer 20. At this stage, the further layer 20 can be removed, if so desired.

A schematic of the arrangement in FIG. 3E is shown in FIG. 3F. As described above, the impurities towards the extremities of the metal layer 14 form the regions 7 of the metal layer indicated in FIG. 3F. These regions 7 have a work function that differs from the work function of the metal layer 14 in a region 9 toward the centre of the channel region 8, owing to the relative lack of impurities in the latter compared to the former.

In order to modify the extent of the regions 7 with respect to the central region 9, an annealing step may now be performed. An anneal would cause diffusion of the impurities in toward the centre of the channel region, thereby tending to increase the extent of the regions 7 relative to the region 9. It is noted that this would also tend to lower the absolute concentration of impurities within the regions 7, and therefore tune their work functions. A typical temperature for the anneal would be in the range 600° to 1100° C. for in the case of a Rapid Thermal Anneal (RTA), or 1000° to 1300° for laser annealing. Laser annealing may be used instead of, or in addition to, an RTA.

Figure 3G:
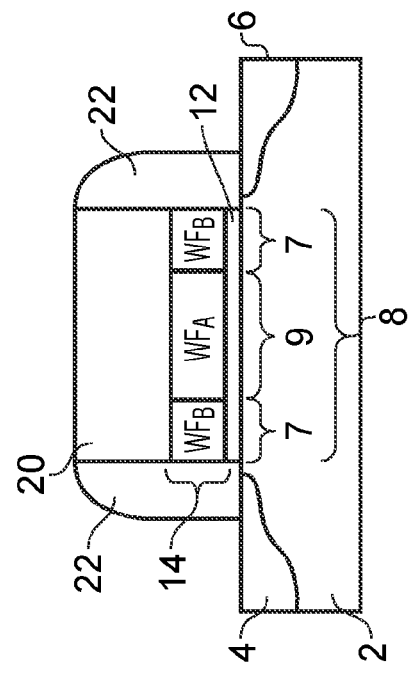

To complete the device, a source region 4, a drain region 6 and spacers 22 can be provided on either side of the gate stack 40. This can be done using standard techniques. The resulting device is shown in FIG. 3G, which corresponds to the device of FIG. 1.

Accordingly, there has been described a semiconductor device and a method of manufacturing a gate stack for such a semiconductor device. The device includes a gate stack that has a gate insulation layer provided over a channel region of the device, and a metal layer that is insulated from the channel region by the gate insulation layer. The metal layer contains work function modulating impurities which have a concentration profile that varies along a length of the metal layer from the source region to the drain region. The gate stack has a first effective work function in the vicinity of a source region and/or the drain region of the device and a second, different effective work function toward a centre of the channel region.

Although particular embodiments of the invention have been described, it will be appreciated that many modifications/additions and/or substitutions may be made within the scope of the claimed invention.

The invention claimed is:

1. A semiconductor device comprising:
   a source region and a drain region;
   a channel region extending between the source region and the drain region; and
   a gate stack comprising:
   a gate insulation layer provided over the channel region; and
   a metal layer insulated from the channel region by the gate insulation layer,
   wherein the metal layer is formed of HfSi, Mo, Ru, TaC or W,
   wherein the metal layer contains work function modulating impurities having a concentration profile that varies along a length of the metal layer from the source region to the drain region,
   wherein the work function modulating impurities comprise (a) As, P, Sb or Te for n-type tuning or (b) Al or B for p-type tuning, and
   wherein the gate stack has a first work effective function in the vicinity of the source region and/or the drain region and a second, different effective work function toward a center of the channel region.

2. The device of claim 1, wherein the device is a PMOS transistor, and wherein the first effective work function is smaller than the effective second work function.

3. The device of claim 1, wherein the device is an NMOS transistor, and wherein the first effective work function is greater than the second effective work function.

4. The device of claim 1, wherein the gate stack comprises a further gate layer provided on the metal layer.

5. The device of claim 4, wherein the further gate layer comprises polysilicon.

6. The device of claim 4, wherein the gate stack is a fully metallic gate stack.

7. The device of claim 1, wherein a length of the channel region between the source region and the drain region is substantially equal to or is less than 65 nm.

8. The device of claim 7, wherein the length of the channel region between the source region and the drain region is substantially equal to or is less than 45 nm.

9. The device of claim 1, wherein a thickness T of the metal layer is in the range 5 nm≤T≤15 nm.

10. The device of claim 1, comprising one of a planar MISFET device or a FinFET device.

11. A method of manufacturing a gate stack for a semiconductor device, the device comprising a channel region extending between a source region and a drain region, the method comprising:
    depositing a plurality of gate stack forming layers on a semiconductor surface, the gate stack forming layers comprising a gate insulating layer on the surface, a metal layer, and a further gate layer on the metal layer;
    patterning the further gate layer in accordance with intended dimensions of the gate stack;
    introducing work function modulating impurities into the metal layer and the patterned further gate layer, wherein the patterned further gate layer masks a portion of the metal layer from the introduction of said impurities;
    patterning the metal layer and gate insulating layer to form the gate stack, the gate stack comprising remaining portions of the gate insulating layer, the metal layer, and the further gate layer; and
    removing the further gate layer,
    wherein the remaining portion of the metal layer contains said work function modulating impurities having a concentration profile that varies along a length of the metal layer from the source region to the drain region of the device, and
    wherein the gate stack has a first effective work function in the vicinity of the source region and/or the drain region and a second, different effective work function toward a center of the channel region.

12. The method of claim 11, wherein the device is a PMOS transistor, and wherein the first effective work function is smaller than the second effective work function.

13. The method of claim 11, wherein the device is an NMOS transistor, and wherein the first effective work function is greater than the second effective work function.

14. The method of claim 11, wherein a length of the channel region between the source region and the drain region is substantially equal to or is less than 65 nm.

15. The method of claim 14, wherein the length of the channel region between the source region and the drain region is substantially equal to or is less than 45 nm.

16. The method of claim 11, wherein a thickness T of the metal layer is in the range 5 nm≤T≤15 nm.

17. The method of claim 11, wherein said introducing work function modulating impurities into the metal layer and the patterned further gate layer comprises a tilted ion implantation process.

18. The method of claim 17, wherein the tilted ion implantation process comprises implanting ions into the metal layer and the patterned further gate layer from at least a first direction and a second, different direction.

19. The method of claim 18, wherein an incident angle $\phi$ of each of the first and second directions with respect to a surface normal of the surface upon which the gate insulation layer is deposited is in the range $15° \leq \phi \leq 30°$.

20. The method of claim 11, further comprising an annealing process, for causing controlled diffusion of the work function modulating impurities in the metal layer toward the centre of the channel region.

* * * * *